United States Patent
Lee et al.

(10) Patent No.: US 6,240,039 B1
(45) Date of Patent: May 29, 2001

(54) SEMICONDUCTOR MEMORY DEVICE AND DRIVING SIGNAL GENERATOR THEREFOR

(75) Inventors: Jung-bae Lee, Kunpo; Chul-woo Yi, Suwon, both of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/524,037

(22) Filed: Mar. 13, 2000

(30) Foreign Application Priority Data

Jun. 26, 1999 (KR) ................................................ 99-24445

(51) Int. Cl.[7] ...................................................... G11C 8/00
(52) U.S. Cl. ................ 365/230.06; 365/189.05; 365/230.08
(58) Field of Search ............................. 365/230.06, 222, 365/226, 189.05, 189.08, 230.08, 230.03

(56) References Cited

U.S. PATENT DOCUMENTS 5,406,526 * 4/1995 Sugibay et al. ................ 365/230.03
5,629,898 * 5/1997 Idei et al. ............................. 365/222
5,966,341 * 10/1999 Takahashi et al. ............... 365/230.03
6,111,808 * 8/2000 Khang et al. .................... 365/230.06

* cited by examiner

Primary Examiner—Richard Elms
Assistant Examiner—Hien Nguyen
(74) Attorney, Agent, or Firm—F. Chau & Associates, LLP

(57) ABSTRACT

A semiconductor memory device is provided having reduced power consumption during a normal operation. The semiconductor memory device includes a sub word-line defined by segmenting a word-line and a driving signal generator for selectively driving the sub word-line according to a column address. The driving signal generator is controlled by a selection signal corresponding to the column address and a mode signal for specifying an operation mode of the semiconductor memory device. The semiconductor memory device enables part of the word-line according to the column address. The semiconductor memory device using a sub word-line driver to reduce the number of memory cells which are sensed, thereby reducing power consumption.

20 Claims, 8 Drawing Sheets

SEMICONDUCTOR MEMORY DEVICE AND DRIVING SIGNAL GENERATOR THEREFOR

BACKGROUND OF THE INVENTION

1. Field of the Invention

The present invention relates to a semiconductor memory device, and more particularly, to a semiconductor memory device where power consumption is lowered by reducing the number of memory cells which are sensed by a sense amplifier.

2. Description of the Related Art

Dynamic random access memories (DRAM) are generally classified dependant upon their operation protocols. For example, a DRAM employing a mode of strobing addresses based upon row address strobe (RASB) signals and column address strobe (CASB) signals is commonly classified as an extended data output DRAM (EDO DRAM). A DRAM employing a mode of strobing commands, addresses, and data based upon clock signals may be classified as a synchronous DRAM. Yet another may be classified as a Rambus DRAM, which employs a mode of strobing commands, addresses and, data in the format of packets based upon clock signals (hereinafter, called a packet protocol mode).

The former two types of DRAMs adopt an address multiplex mode in which the row and column addresses are input through the same pin at predetermined intervals (tRCDmin). On the other hand, the Rambus type DRAM which employs the packet protocol mode may adopt a mode in which the row address and the column address are simultaneously input at a predetermined time, or they are input for a period of time shorter than the tRCDmin. The tRCDmin for DRAM may vary from chip to chip. Here, tRCDmin indicates a time interval for ensuring that a word-line specified by the row address is activated. The tRCDmin time interval also ensures that the bit-line sensing, and read and write operations are performed according to the column address. The packet protocol mode is similar to an address non-multiplex mode in a static RAM (SRAM). In an address non-multiplex mode the row and column addresses may be simultaneously input through different pins.

DRAM operates in either a normal operation mode or a refresh operation mode. The normal operation mode is divided into an operation that selects memory cells and an operation that determines whether read or write will be performed while controlling the input and output of data for selected cells. The operation for selecting a memory cell includes several steps. The operation decodes a row address and selects a corresponding word-line. The operation senses and amplifies bit-lines connected to the selected word-line using sense amplifiers. The operation decodes a column address and selects a corresponding bit-line to provide an output through an input/output line. Finally, the memory cell which is connected to the word-line selected by the row address, and to the bit-line selected by the column address, is selected.

The refresh operation is automatically and periodically performed while generating an internal address which successively changes. The refresh operation is divided into an operation for selecting word-lines, and an operation for sensing and amplifying bit-lines connected to selected word-lines. The word-lines are selected by using sense amplifiers to restore the charge of the memory cells. The operation for selecting a corresponding word-line in the refresh operation is the same as that in the normal operation, with the exception that the internally generated address is used in the refresh operation.

In other words, operations associated with a row address (i.e., the decoding of the row address, the activation of a selected word-line, and the sensing of all bit-lines connected to the selected word-line) in the normal operation mode are essentially the same as those in the refresh operation mode. The difference between the two operation modes is that the normal operation mode uses an external address, and the refresh operation mode uses an internal address.

FIG. 1 is provided to show the concept of word-line selection performed in EDO DRAM. FIG. 2 is provided to show the concept of word-line selection performed in synchronous DRAM.

The following description referring to FIGS. 1 and 2 concerning the number of word-lines and memory cells activated in each normal operation mode of EDO DRAM and synchronous DRAM, respectively. During the normal operation, once a command for controlling the operations associated with a row and a row address are input, as shown in FIG. 1, the word-lines W/L represented by solid lines are activated in EDO DRAM for 8K refresh. Similarly, the word-lines W/L represented by both solid lines and doted lines are activated in EDO DRAM for 4K refresh. While, as shown in FIG. 2, the word-lines W/L represented by solid lines are activated in a bank in synchronous DRAM for 4K refresh. Accordingly, a sensing operation may be performed with respect to the following during the normal operation: a 8K memory cell in EDO DRAM in 8K refresh; a 16K memory cell in EDO DRAM in 4K refresh; and a 4K memory cell (in case where only one bank is selected) in synchronous DRAM in 4K refresh.

Read and write are actually performed with respect to only 4~32 cells among the sensed 8K cells. The locations of memory cells to be read from, and written to, cannot be recognized until a column address is applied.

In the case of a DRAM which employs the address multiplex mode, such as EDO DRAM, or synchronous DRAM, to ensure the completion of the operations associated with a row, a column address must be input after a predetermined period of time (tRCDmin) has passed from the time a row address is input. Consequently, during the normal operation of DRAM in address multiplex mode, the sensing operation should be continuous with respect to all memory cells connected to activated word-lines W/L, until the column address is applied. Even though only a very small number of the 8K cells (in case of 64M) are to be used. Such a continuous sensing operation consumes a large amount of sensing current.

The following description referring to FIGS. 1 and 2 concerns the numbers of word-lines W/L and memory cells activated in each refresh operation of EDO DRAM and synchronous DRAM. During the refresh operation, once an internal address is input, as shown in FIG. 1, word-lines W/L represented by solid lines are activated in EDO DRAM for 8K refresh, and word-lines W/L represented by both solid lines and doted lines are activated in EDO DRAM for 4K refresh. As shown in FIG. 2, word-lines W/L represented by both solid lines and doted lines are activated in synchronous DRAM for 4K refresh. Accordingly, a sensing operation is performed with respect to the following during the refresh operation: a 8K memory cell in EDO DRAM in 8K refresh; a 16K memory cell in EDO DRAM in 4K refresh; and a 16K memory cell in synchronous DRAM in 4K refresh.

In DRAM employing the address multiplex mode, EDO DRAM and synchronous DRAM, the same number of word-lines are activated in the normal operation as in the refresh operation when all banks are activated.

Therefore, it may be desirable to have a DRAM which employs the address non-multiplex mode or a DRAM which employs the packet protocol mode which does not need to sense memory cells that will not be used during the normal operation because row and column addresses are input simultaneously or for a period of time shorter than tRCDmin. Accordingly, in semiconductor memory devices employing the address non-multiplex mode or the packet protocol mode and the like, where row and column addresses are input for a period of time shorter than tRCDmin, if the sensing operation is performed for those memory cells selected by the column address, consumption of the current may be reduced.

SUMMARY OF THE INVENTION

It is an object of the present invention to provide a semiconductor memory device in which, during a normal operation only some memory cells are sensed among memory cells connected to a selected word-line, the row and column addresses being input for a period of time shorter than a RAS to CAS delay time (tRCDmin), thereby reducing power consumption.

It is another object of the present invention to provide a driving signal generator suitable for the above semiconductor memory device.

To achieve an object of the present invention, a semiconductor memory device including sub word-lines is provided. The sub word-lines are defined by segmenting word-lines in the direction of a column and a driving signal generator for selectively driving the sub word-lines according to a column address. The driving signal generator is controlled by a selection signal corresponding to the column address and a mode signal for specifying an operation mode of the semiconductor memory device. The semiconductor memory device selects only a part of sub word-lines by segmenting the word-line according to the column address, thereby reducing the number of memory cells sensed.

To achieve another object of the present invention, a driving signal generator including a control signal generator is provided. The control signal generator generates a control signal in response to a selection signal based upon a column address and a mode signal for specifying a normal or refresh operation of a semiconductor memory device, an AND gate for performing an AND operation with respect to a word-line selection signal and the control signal, and a latch for latching and providing an output of the AND gate to a sub word-line driver.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS OF THE INVENTION

The present invention now will be described more fully with reference to the accompanying drawings, in which preferred embodiments of the invention are shown.

Figure 1:
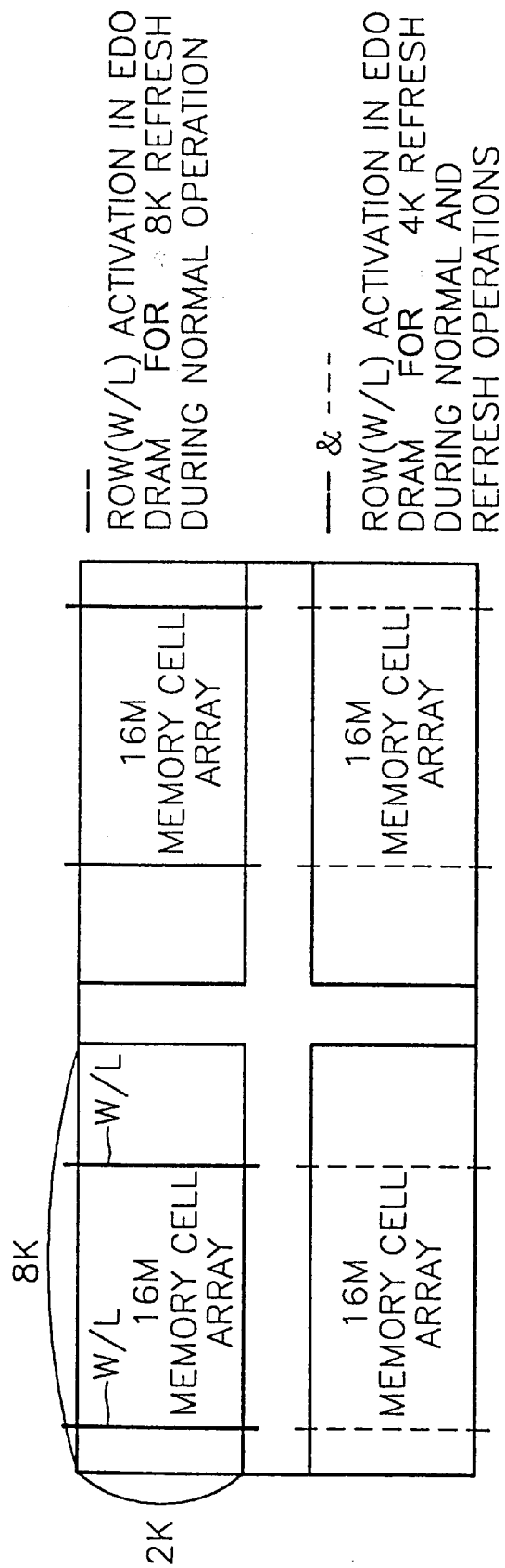
FIG. 1 shows a prior art word-line selection operation in a 64M extended data output dynamic random access memory (EDO DRAM)
Figure 2:
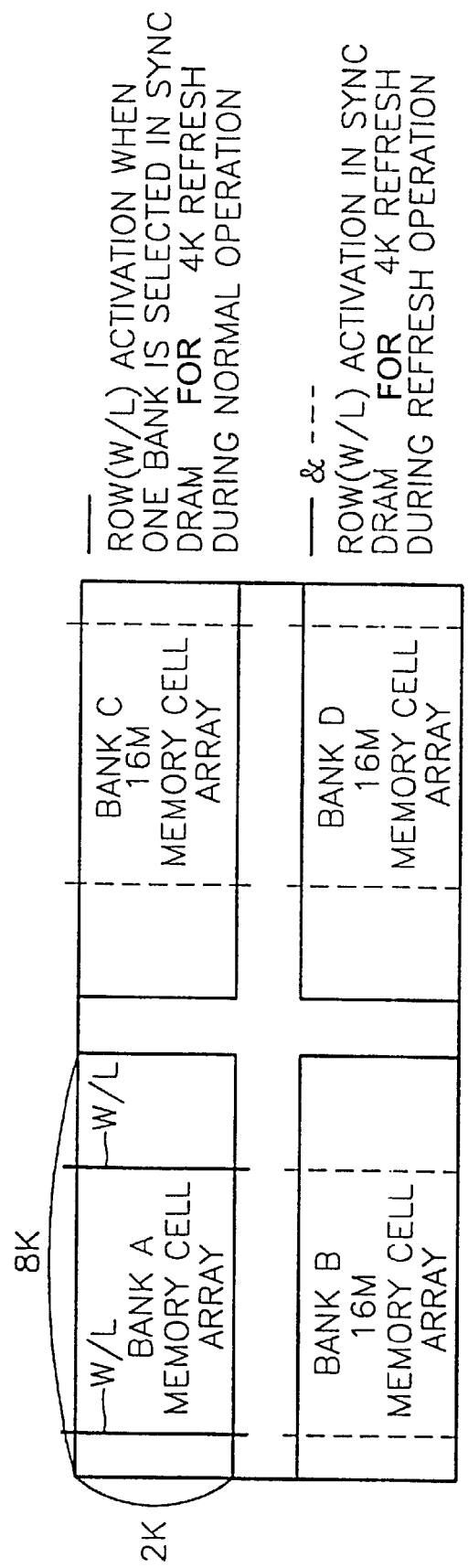
FIG. 2 shows a prior art word-line selection operation in a 64M synchronous dynamic random access memory (DRAM)
Figure 3:
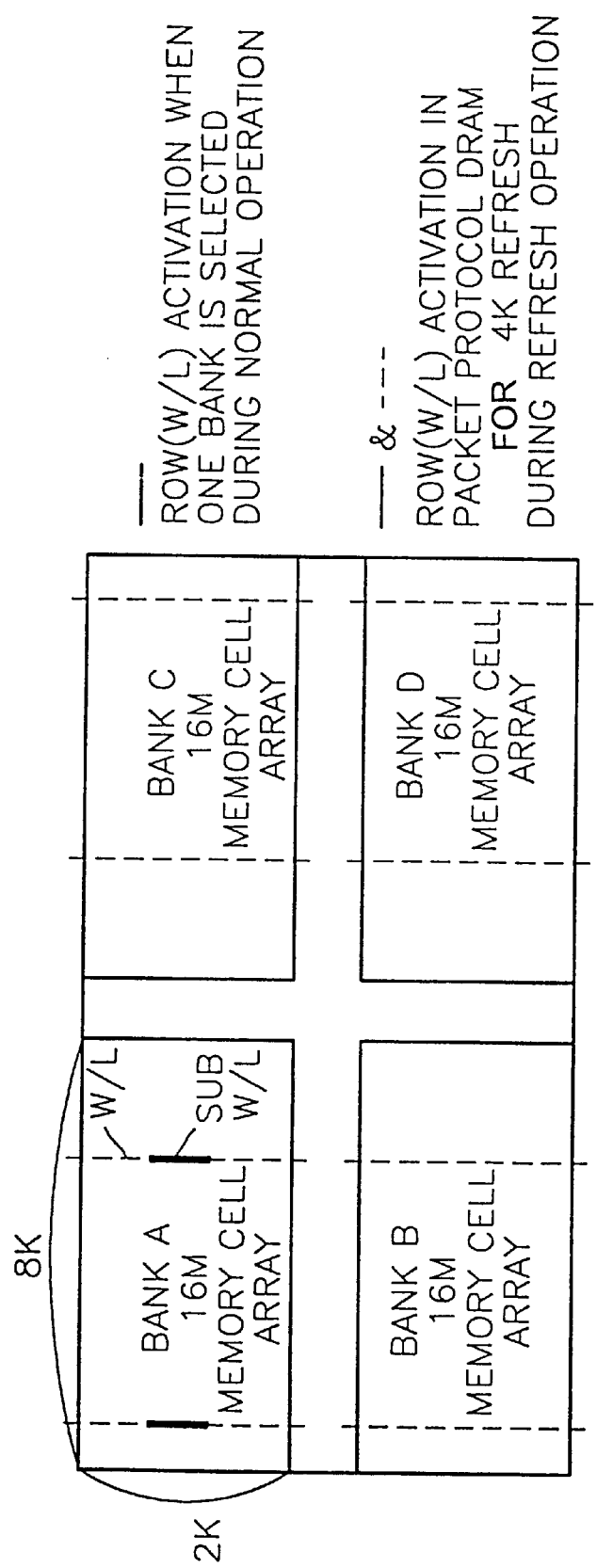
FIG. 3 shows a word-line selection operation in a semiconductor memory device according to the present invention.

Referring to FIG. 3, during a normal operation, a semiconductor memory device according to a preferred embodiment of the present invention drives a portion of word-lines, hereafter referred to as "sub word-lines." Only sub word-lines connected to memory cells to be accessed are driven. Sub word-lines are word-lines W/L divided in a column direction.

In other words, doted lines represent word-lines W/L selected by row addresses. Among the word-lines W/L, the selected portions of the word-lines W/L, which are shown by solid lines, are enabled during the normal operation. The solid lines indicate sub word-lines connected to memory cells selected by column addresses. These sub word-lines are defined by segmenting the word-lines W/L in the column direction.

Figure 4:
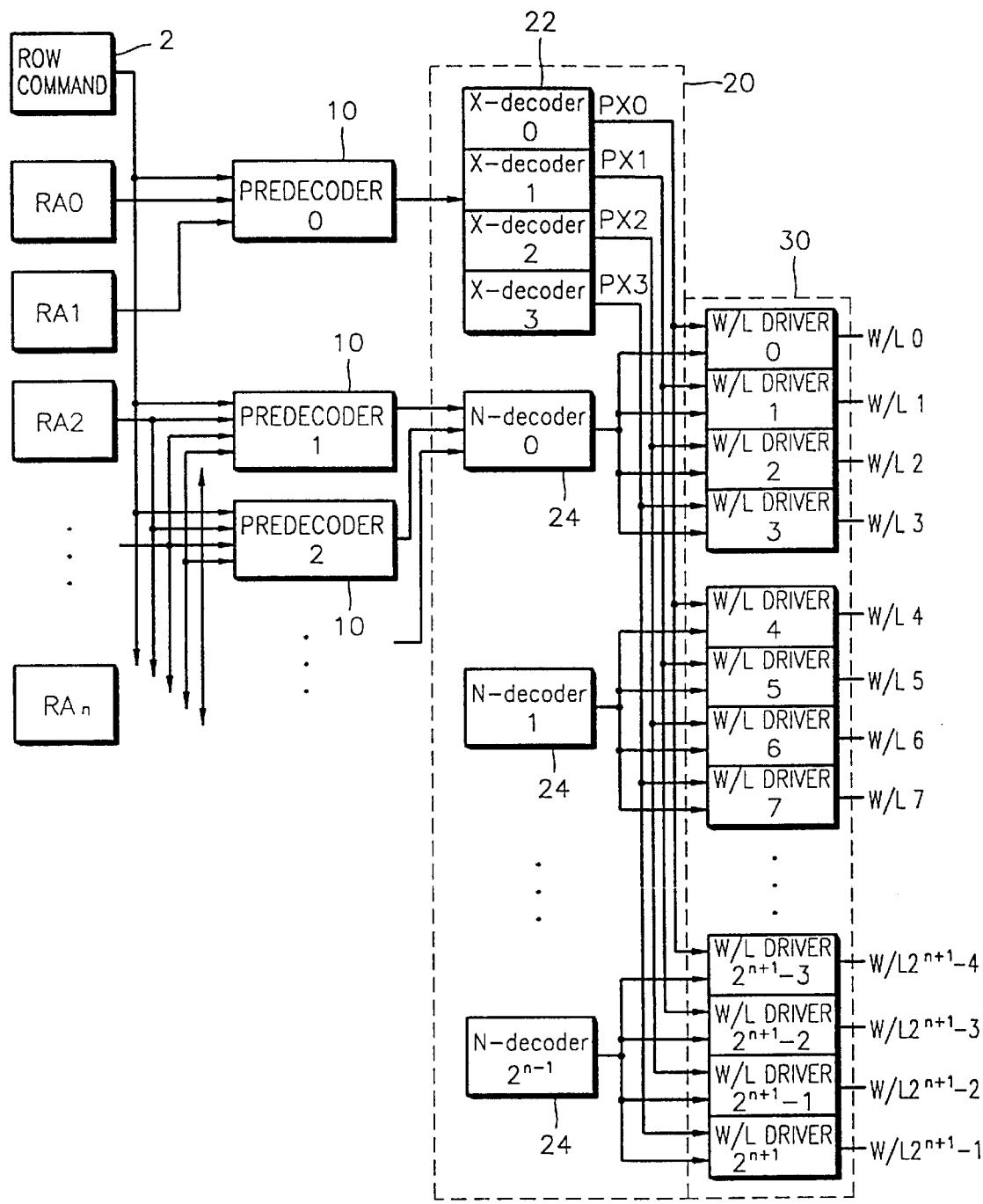
FIG. 4 is a block diagram of a conventional row decoder.

Referring to FIG. 4, a block diagram of a conventional decoder, once a row command 2 for controlling a row operation of a semiconductor memory device is activated, a row address RA0–RAn is input. The row address RA0–RAn is pre-decoded by a pre-decoder 10. The pre-decoded row address is then input to a main decoder 20. The main decoder 20 comprises X-decoders 22 and N-decoders 24.

Assuming that an address input into the X-decoders 22 comprises a first least significant bit RA0 and a second least significant bit RA1 of the row address, and the number of bits input into the N-decoders 24 is the number of bits from the third least significant bit RA2 to the most significant bit Ran, i.e., n−1, the number of X-decoders 22 is $2^2=4$ and the number of N-decoders 24 is $2^{n-1}$. Word-lines W/L are selected by a combination of the outputs from the X-decoders 22 and the outputs from the N-decoders 24. Therefore, the number of selected word-lines W/L is $2^{n+1}$.

Each of outputs, PX0, PX1, PX2, and PX3, of the X-decoders 22 is input into each group of four word-line (W/L) drivers 30 for driving word-lines W/L0–W/L$2^{n+1}$1. Further, the output of each N-decoder 24 is input into corresponding groups of four word-line drivers. For example, PX0 is input to W/L drivers 0, 4, . . . and $2^{n+1}$ 3 and the output of N-decoder 0 is input into W/L drivers 0, 1, 2 and 3.

There are two methods of arranging word-lines and word-line drivers in a memory cell array. One is arranging a word-line in a column direction of a memory cell array and providing a single word-line driver at an end of the memory cell array (or an end of the word-line) for driving the word-line. The other is segmenting a word-line in the column direction and providing sub word-line drivers (SWD) for separately driving segmented parts of the word-line in a memory cell array. As memories become more highly integrated, the latter method is being used more.

Figure 5:
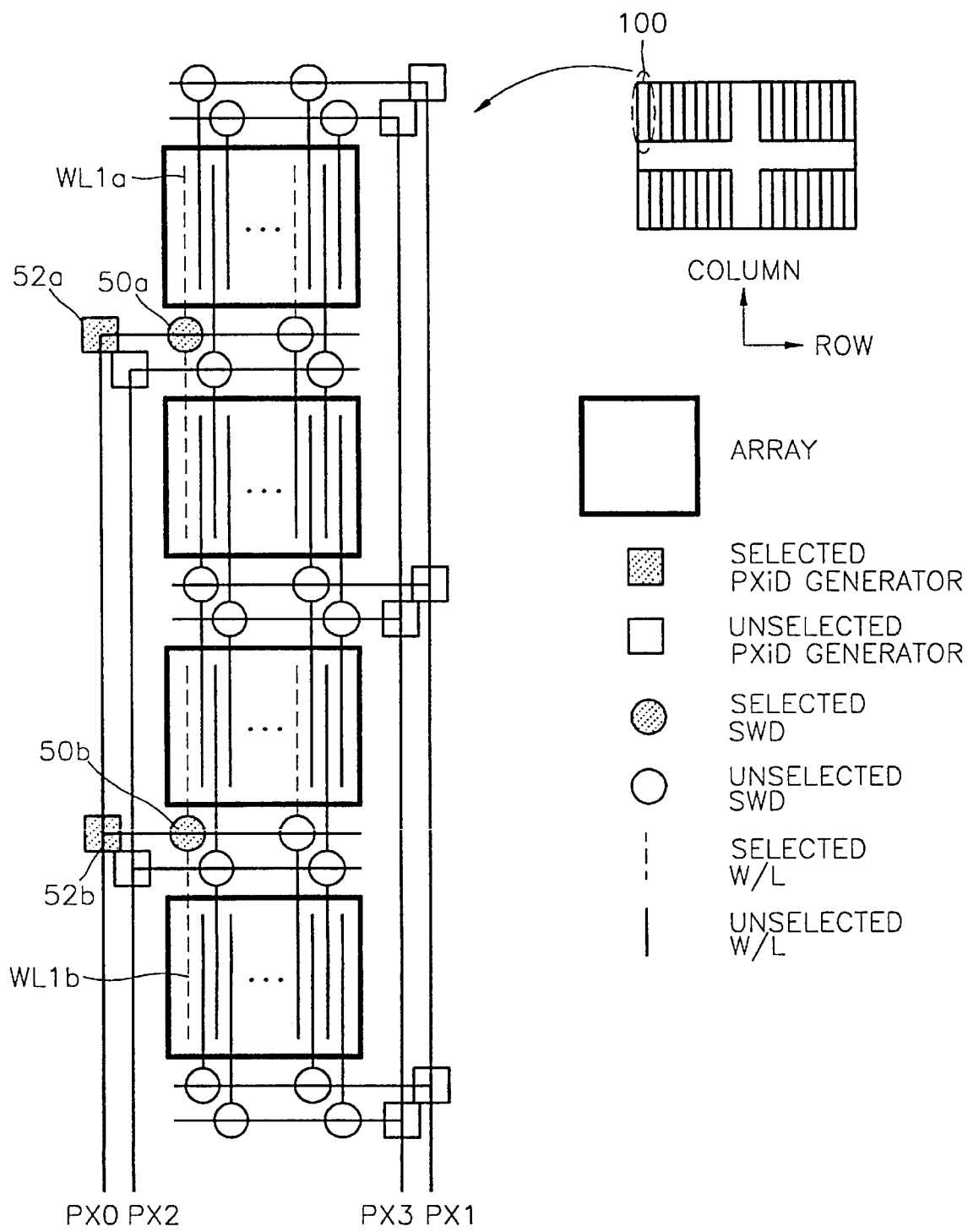
FIG. 5 shows a prior art arrangement of word-lines and sub word-line drivers in a conventional semiconductor memory device.

Referring to FIG. 5, a prior art memory cell array 100 is segmented into four groups in a column direction. Each sub word-line driver (SWD) is allocated to two groups. For example, a word-line W/L is segmented into two sub word-lines WL1a and WL1b. Each sub word-line extends from a sub word-line driver through the length of the two adjacent groups. The SWDs 50a and 50b segment sub word-lines WL1a and WL1b, respectively.

The first SWD 50a drives the segmented sub word-line WL1a. The second SWD 50b drives the segmented sub word-line WL1b.

Although not shown in FIG. 5, an output of one of the N-decoders 24 is wired in a column direction so that it is input into SWDs of the same word-line W/L. For example, the first and second SWDs 50a and 50b. Each of the outputs, PX0, PX1, PX2, and PX3, of the X-decoders 22 is wired in a row direction, shown in FIG. 5, via corresponding PXiD generators so that it is input into corresponding SWDs.

Specifically, once a word-line W/L is selected and PX0 is in an active state, PX0 enables the SWDs 50a and 50b, via the PXiD generators 52a and 52b. Therefore, the two sub word-lines WL1a and WL1b, are enabled. Accordingly, sensing operation is performed with respect to all memory cells connected to the selected word-line W/L including the sub word-lines WL1a and WL1b.

Among the memory cells connected to the selected word-line W/L, the memory cells are selected by a column address. Here, assuming that the most significant bit (MSB) of the column address is CAi, and CAi is "high," half of the memory cells connected to the same word-line W/L are unnecessarily sensed. The other half of the memory cells are selected when CAi has a "low" level. In this instance, if a SWD connected to the memory cells selected by the "low" level of CAi is disabled, and only a SWD connected to the memory cells selected by the "high" level of CAi is enabled, consumption of current may be reduced.

Referring again to FIG. 5, the signal which is actually input into each of the SWDs is not PXi (I=0, 1, 2, 3) but PXiD which is an output of each of the PXiD generators. Thus, if neither of the PXiD generators 52a and 52b are enabled, neither of the corresponding SWDs 50a and 50b can be enabled. Accordingly, a corresponding sub word-line cannot be enabled.

Figure 6:
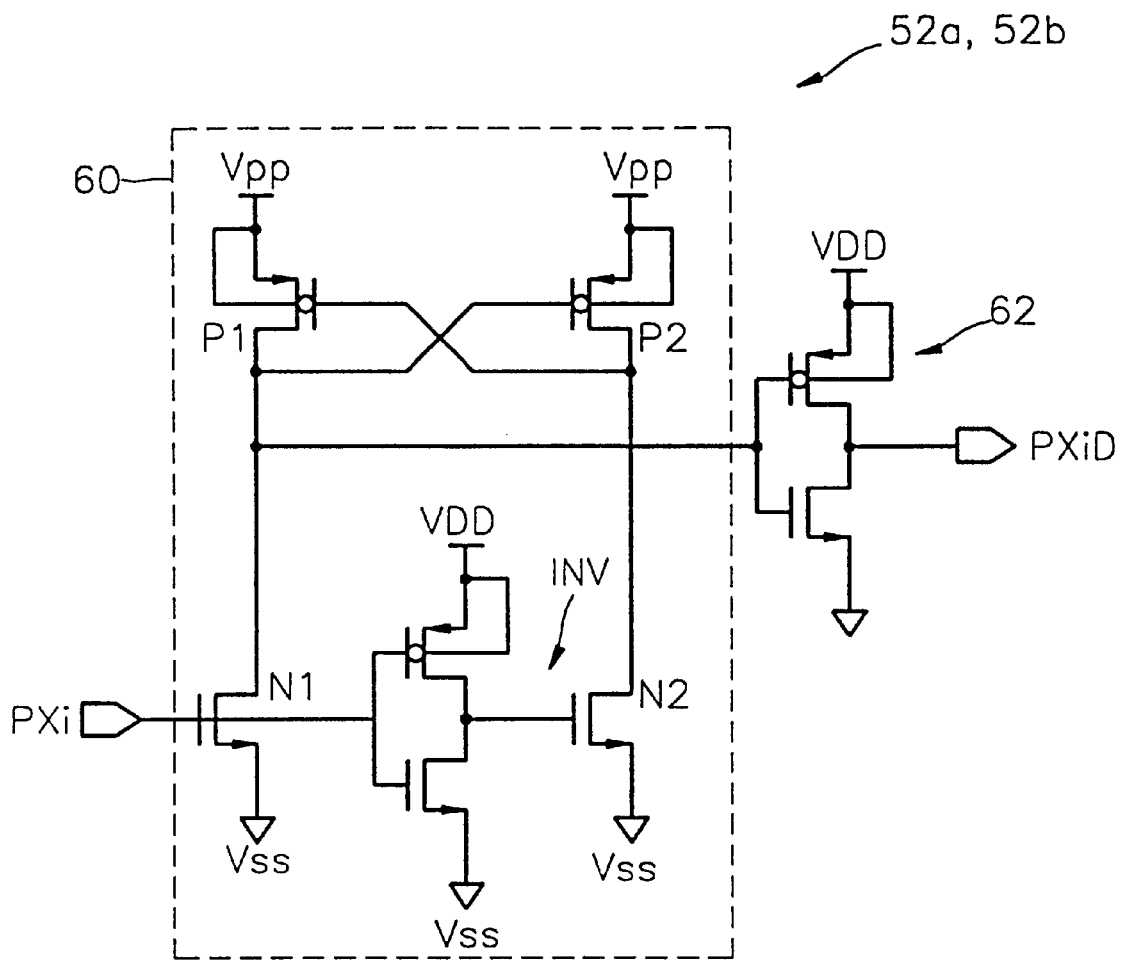
FIG. 6 shows a prior art circuit diagram illustrating a configuration of a PXiD generator depicted in FIG. 5.

FIG. 6 shows a schematic of the PXiD generator of FIG. 5. Each PXiD generator comprises a latch 60 and a driver 62. The latch 60 comprises two PMOS transistors P1 and P2 whose gates and sources are cross-connected, two NMOS transistors N1 and N2 connected to respective PMOS transistors P1 and P2 in serial, and an inverter INV connected between the gates of the NMOS transistors N1 and N2. The latch 60 latches the PXi signal. For example, when the PXi signal applied to the gate of the first NMOS transistor N1 is at a "high" level (hereinafter, represented as "H"), the first NMOS transistor N1 is turned on and the drain potential of the first NMOS transistor N1 becomes "low" level (hereinafter, represented as "L"). PXi is inverted by the inverter INV so that "L" is applied to the gate of the second NMOS transistor N2. Accordingly, the second NMOS transistor N2 is turned off and the drain potential of the second NMOS transistor N2 becomes "H." Since the drain of the first NMOS transistor N1 is connected to the gate of the second PMOS transistor P2, and the drain of the second NMOS transistor N2 is connected to the gate of the first PMOS transistor P1, the first PMOS transistor P1 is turned off and the second PMOS transistor P2 is turned on. Accordingly, the drain of the first NMOS transistor N1 remains "L" and that of the second NMOS transistor N2 remains "H."

On the other hand, when the PXi signal applied to the gate of the first NMOS transistor N1 is at the "L" level, the first NMOS transistor N1 is turned off and the drain potential becomes "H." PXi is inverted by the inverter INV so that "H" is applied to the gate of the second NMOS transistor N2. Accordingly, the second NMOS transistor N2 is turned on and the drain potential becomes "L." Since the drain of the first NMOS transistor N1 is connected to the gate of the second PMOS transistor P2 and the drain of the second NMOS transistor N2 is connected to the gate of the first PMOS transistor P1, the first PMOS transistor P1 is turned on and the second PMOS transistor P2 is turned off. Accordingly, the drain of the first NMOS transistor N1 remains "H" and that of the second NMOS transistor N2 remains "L."

The PXi signal is applied to the driver 62 via the drain of the first NMOS transistor N1. The driver 62 inverts an input signal to provide an output. Because the PXi signal is inverted at the drain of the first NMOS transistor N1 and then inverted again at the driver 62, PXiD has the same phase as PXi.

The present invention performs a logic operation with respect to PXi. The invention uses a control signal which enables one of a pair of PXiD generators and disables the other. The control signal is generated in response to a selection signal. The selection signal selects a PXiD generator based upon a column address and a mode signal. The mode signal specifies the normal/refresh operation of a semiconductor memory device.

Figure 7:
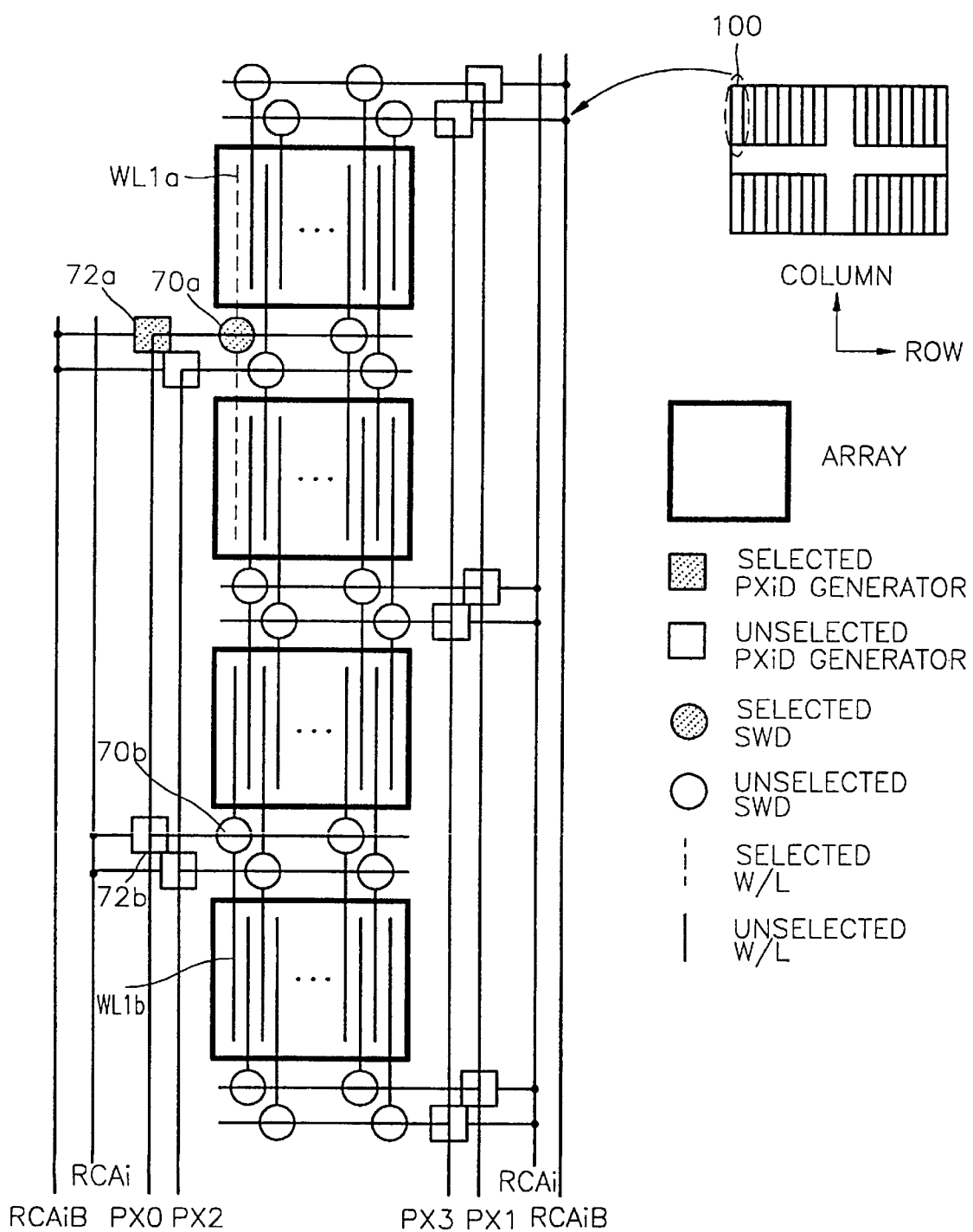
FIG. 7 shows a preferred embodiment of an arrangement of word-lines and sub word-line drivers in a semiconductor memory device according to the present invention.

FIG. 7 shows a preferred embodiment of a word-line and sub word-line arrangement according to the present invention. One difference between the present invention and the prior art shown in FIG. 5 is that the PXiD generators are enabled or disabled according to control signals RCAiB and RCAi, respectively. The control signals RCAi and RCAiB are generated by performing a logic operation with respect to a column address and a mode signal.

Specifically, when PX0 is activated and RCAiB="H" (RCAi="L"), only SWD 70a is enabled. Thus, only half of a first word-line W/L, namely, the sub word-line WL1a, is enabled. On the other hand, when PX0 is activated and RCAi="H" (RCAiB="L"), only SWD 70b, is enabled. It can be seen that only a half of the first word-line W/L is enabled at any given time.

In other words, the PXiD generators are enabled or disabled according to RCAi and RCAiB so that only a part of the sub word-lines of a word-line can be enabled, thereby reducing power consumption. Enabling/disabling the PXiD generators is effected by performing a logic operation with respect to PXi and RCAi/RCAiB.

Figure 8:
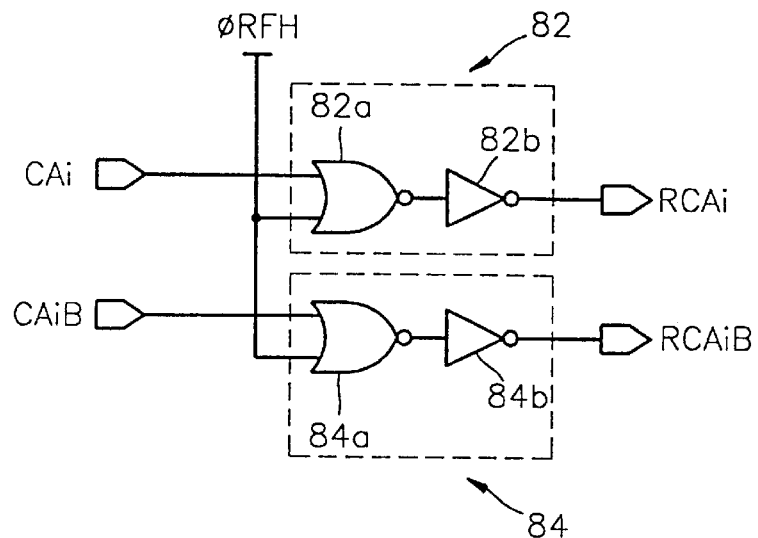
FIG. 8 is a schematic circuit diagram of an OR gate for generating control signals depicted in FIG. 7.

Referring to FIG. 8, the control signal generator for generating the control signals RCAi and RCAiB includes two gates. The first OR gate 82 receives the most significant bit CAi of a column address and a mode signal φRFH, and generating RCAi. The second OR gate 84 for receiving CAiB having a complementary logic level to CAi and the mode signal φRFH, and generating RCAiB. The OR gates 82 and 84 respectively include NOR gates 82a and 84a and inverters 82b and 84b. Here, φRFH is the mode signal which represents an operation mode of a semiconductor memory device. When ΦRFH is at the "H" level, it indicates the refresh mode. When φRFH is at the "L" level, it indicates the normal mode.

When φRFH is at the "H" level, that is, in the case of the refresh mode, the OR gates 82 and 84 respectively output the control signals RCAi and RCAiB as a "H" level, regardless of logic levels of CAi and CAiB. Accordingly, the PXiD generators are enabled or disabled according to PXi. For example, because the sub word-lines WL1a and WL1b are both enabled or disabled according to PX0, memory cells connected to the word-line W/L consisting of the sub word-lines WL1a and WL1b are all sensed.

In the normal mode, when φRFH is at the "L" level, the OR gates 82 and 84 respectively output the control signals RCAi and RCAiB, depending upon the logic levels of CAi and CAiB. Accordingly, only a part of a word-line is driven.

When CAi is "H" (CAiB="L"), RCAi output from the OR gate 82 becomes "H." Accordingly, PXiD generators associated with RCAi are enabled or disabled according to PXi. For example, the second PXiD generator 72b is enabled or disabled depending on PX0.

Since CAiB is "L," RCAiB output from the OR gate 84 becomes "L." As a result, as described in FIG. 7, PXiD generators associated with RCAiB are disabled regardless of PXi. For example, the first PXiD generator 72a is disabled regardless of PX0.

In this situation (CAi="H," CAiB="L"), for example, even if PX0 is activated, the first PXiD generator 72a is disabled, and the second PXiD generator 72b is enabled. Thus, the first SWD 70a is disabled and the second SWD 70b is enabled. Accordingly, the first sub word-line WL1a is not driven and the second sub word-line WL1b is driven. Consequently, only the memory cells connected to the second sub word-line WL1b are sensed.

On the other hand, when CAi is "L" (CAiB="H"), RCAi output from the OR gate 82 becomes "L." As a result, as described in FIG. 7, the PXiD generators associated with RCAi are disabled regardless of PXi. For example, the second PXiD generator 72b is disabled regardless of PX0.

Since CAiB is "H," RCAiB output from the OR gate 84 becomes "H." As a result, as described in FIG. 7, the PXiD generators associated with RCAiB are enabled or disabled depending upon PXi. In other words, the first PXiD generator 72a is enabled or disabled depending upon PX0.

In this situation (CAi="L," CAiB="H"), for example, even if PX0 is activated, the second PXiD generator 72b is disabled, and the first PXiD generator 72a is enabled. Thus, the first SWD 70a is enabled and the second SWD 70b is disabled. Accordingly, the first sub word-line WL1a is driven and the second sub word-line WL1b is not driven. Consequently, only the memory cells connected to the first sub word-line WL1a are sensed.

In other words, either a first sub word-line or a second sub word-line is driven according to the logic levels of CAi and CAiB. Because a first sub word-line and a second sub word-line are defined by segmenting a single word-line W/L in the column direction, among the memory cells connected to the word-line W/L, either memory cells corresponding to an upper column address or memory cells corresponding to a lower column address are sensed according to CAi and CAiB. Therefore, sensing current can be reduced as compared with conventional technology in which all the memory cells connected to the word-line W/L are sensed.

Although CAi is the most significant bit of a column address and a word-line is segmented into two sub word-lines in a column direction in FIG. 7, it is obvious that the word-line can be segmented into $2^q$ (here, q=1, 2, 3, ... ) sub word-lines and q upper bits of the column address can be used, thereby reducing the sensing current by ½, ¼, ⅛ and so on.

Figure 9:
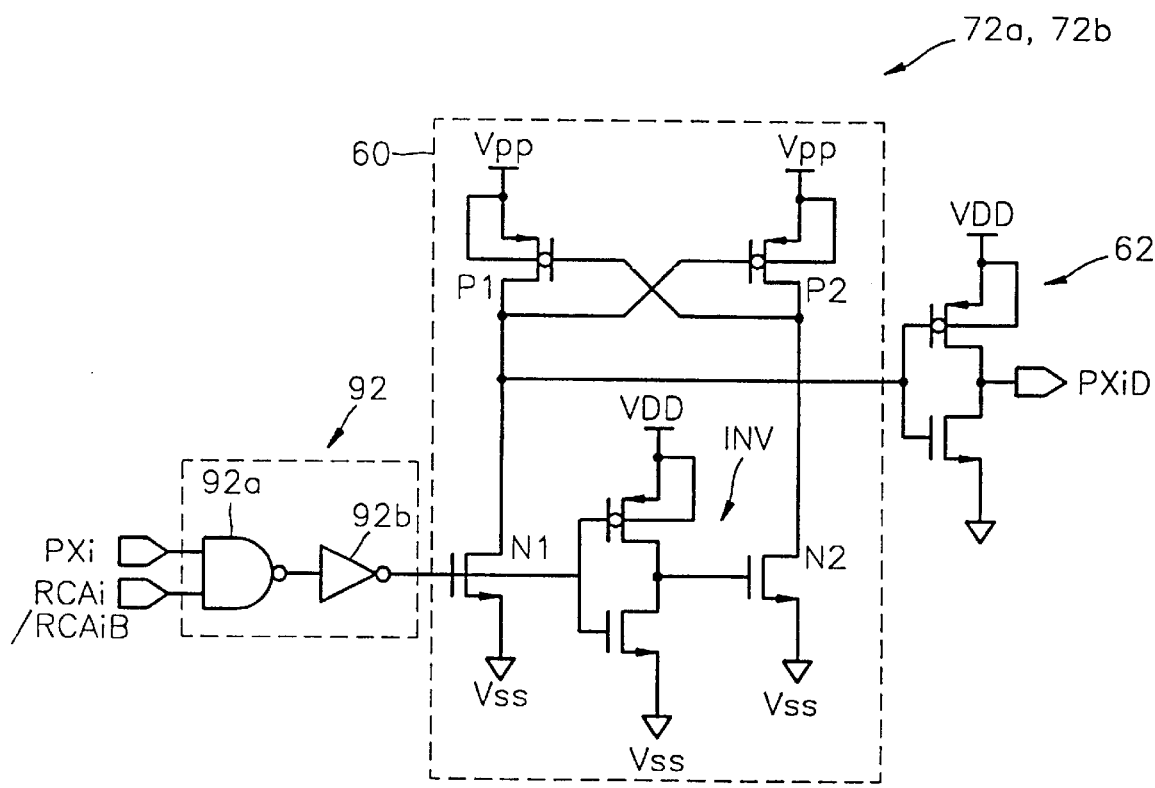
FIG. 9 is a schematic circuit diagram of a PXiD generator depicted in FIG. 7.

Referring to FIG. 9, as compared with the circuit depicted in FIG. 6, the circuit of FIG. 9 includes the same elements having the same reference numerals, and further includes an AND gate 92 for enabling or disabling the latch 60 according to RCAi or RCAiB. The AND gate 92 includes a NAND gate 92a and an inverter 92b. For example, PX0 and RCAiB are input into the AND gate 92 in the first PXiD generator 72a of FIG. 7 and PX0 and RCAi are input into the AND gate 92 in the second PXiD generator 72b of FIG. 7.

In the case of the first PXiD generator 72a, when RCAiB is "H" and input into the AND gate 92, PX0D is output as a "H"/"L" level depending upon the logic level of PX0. On the other hand, when RCAiB is "L," PX0D is output as a "L" level regardless of the logic level of PX0. Accordingly, the first SWD 70a is enabled or disabled according to PX0 when RCAiB is "H" and disabled regardless of PX0 when RCAiB is "L."

In the case of the second PXiD generator 72b, when RCAi is "H" and input into the AND gate 92, PX0D is output as a "H"/"L" level depending upon the logic level of PX0. On the other hand, when RCAi is "L," PX0D is output as a "L" level regardless of the logic level of PX0. Accordingly, the second SWD 70b is enabled or disabled according to PX0 when RCAi is "H" and disabled regardless of PX0 when RCAi is "L."

Referring to FIG. 8, in the case of the refresh mode (φRFH="H"), both RCAi and RCAiB are at a "H" level. Thus, the pairs of PXiD generators 72a and 72b, SWDs 70a and 70b, and sub word-lines WL1a and WL1b are enabled or disabled depending upon PX0. On the other hand, in the case of the normal mode (φRFH="L"), RCAi and RCAiB have logic levels depending upon CAi and CAiB. In this instance the PXiD generators 72a and 72b, the SWDs 70a and 70b, and the sub word-lines WL1a and WL1b are enabled or disabled depending upon PX0, CAi and CAiB.

Advantageously, a semiconductor memory device according to the present invention enables part of sub word-line according to a column address, using a sub word-line driver to reduce the number of memory cells which are sensed, thereby reducing current consumption.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device comprising:
   a sub word-line provided by segmenting a word-line;
   a sub word-line driver for driving the sub word-line;
   a driving signal generator for driving the sub word-line driver in response to a word-line selection signal for selecting the word-line based upon a row address and a control signal; and
   a control signal generator for outputting the control signal to the driving signal generator in response to a driving signal generator selection signal for selecting the driving signal generator based upon a column address and a mode signal.

2. The device of claim 1, wherein the control signal generator is an OR gate which performs an OR operation with respect to the driving signal generator selection signal and the mode signal, the mode signal for specifying a normal or a refresh operation of the semiconductor memory device.

3. The device of claim 1, wherein the driving signal generator selection signal is obtained by decoding a part of the column address.

4. The device of claim 3, wherein the driving signal generator selection signal is obtained by decoding the part of the column address including a most significant bit of the column address.

5. The device of claim 4, wherein the driving signal generator selection signal is obtained by decoding the most significant bit of the column address.

6. The device of claim 5, wherein the control signal generator is an OR gate which performs an OR operation with respect to the mode signal and the most significant bit of the column address, the mode signal for specifying a normal or a refresh operation of the semiconductor memory device.

7. The device of claim 1, wherein the driving signal generator comprises:

an AND gate for performing an AND operation with respect to the word-line selection signal and the control signal; and a latch for latching and providing an output of the AND gate to the sub word-line driver.

8. The device of claim 1, wherein the semiconductor memory device is a dynamic random access memory device adopting a mode of strobing a command, an address and data in the format of packets.

9. A driving signal generator in a semiconductor memory device including a sub word-line defined by segmenting a word-line and a sub word-line driver for driving the sub word-line, the driving signal generator driving the sub word-line driver in response to a word-line selection signal for selecting the word-line based upon a row address, the driving signal generator comprising:

a control signal generator for generating a control signal in response to a driving signal generator selection signal and a mode signal, said driving signal generator selection signal being based upon a column address and said mode signal for specifying a normal or refresh operation of the semiconductor memory device;

an AND gate for performing an AND operation with respect to the word-line selection signal and the control signal; and a latch for latching and providing an output of the AND gate to the sub word-line driver.

10. The driving signal generator of claim 9, wherein the control signal generator is an OR gate for performing an OR operation with respect to the driving signal generator selection signal and the mode signal.

11. The driving signal generator of claim 10, wherein the driving signal generator selection signal is obtained by decoding a part of the column address.

12. The driving signal generator of claim 11, wherein the driving signal generator selection signal is obtained by decoding the part of the column address including the most significant bit of the column address.

13. The driving signal generator of claim 12, wherein the driving signal generator selection signal is obtained by decoding the most significant bit of the column address.

14. The driving signal generator of claim 11, wherein the column address is applied for a period of time shorter than a minimum RAS to CAS delay time (tRCD) of a memory core.

15. The driving signal generator of claim 12, wherein the column address is applied for a period of time shorter than a minimum RAS to CAS delay time (tRCD) of a memory core.

16. The driving signal generator of claim 13, wherein the column address is applied for a period of time shorter than a minimum RAS to CAS delay time (tRCD) of a memory core.

17. A semiconductor memory device where a row address and a column address are applied for a period of time shorter than a minimum row address strobe (RAS) to column address strobe (CAS) delay time (tRCD) of a memory core, a word-line corresponding to a row address is driven and memory cells connected to the driven word-line are sensed, the semiconductor memory device comprising:

a sub word-line provided by segmenting the word-line;

a sub word-line driver for driving the sub word-line;

a driving signal generator for driving the sub word-line driver in response to a word-line selection signal for selecting the word-line based upon the row address and a control signal; and a control signal generator for outputting the control signal to the driving signal generator in response to a driving signal generator selection signal for selecting the driving signal generator based upon the column address and a mode signal for specifying a normal or a refresh operation of the semiconductor memory device, the driving signal generator selection signal is obtained by decoding the part of the column address including a most significant bit of the column address.

18. The device of claim 17, wherein the control signal generator is an OR gate which performs an OR operation with respect to the driving signal generator selection signal and the mode signal.

19. The device of claim 17, wherein the control signal generator is an OR gate which performs an OR operation with respect to the mode signal and the most significant bit of the column address.

20. The device of claim 17, wherein the driving signal generator comprises:

an AND gate for performing an AND operation with respect to the word-line selection signal and the control signal; and a latch for latching and providing an output of the AND gate to the sub word-line driver.

* * * * *